United States Patent
Lee et al.

(10) Patent No.: US 9,350,347 B2
(45) Date of Patent: May 24, 2016

(54) LEVEL SHIFT CIRCUIT AND DC-DC CONVERTER FOR USING THE SAME

(71) Applicant: GREEN SOLUTION TECHNOLOGY CO., LTD., New Taipei (TW)

(72) Inventors: Li-Min Lee, New Taipei (TW); Chao Shao, Wuxi (CN); Quan Gan, Wuxi (CN); Yuan Cai, Wuxi (CN)

(73) Assignee: GREEN SOLUTION TECHNOLOGY CO., LTD., New Taipei (TW)

( * ) Notice: Subject to any disclaimer, the term of this patent is extended or adjusted under 35 U.S.C. 154(b) by 100 days.

(21) Appl. No.: 14/201,917

(22) Filed: Mar. 9, 2014

(65) Prior Publication Data

US 2015/0130428 A1    May 14, 2015

(30) Foreign Application Priority Data

Nov. 12, 2013  (CN) .......................... 2013 1 0561010

(51) Int. Cl.

| H03L 5/00 | (2006.01) |
|---|---|
| H03K 19/00 | (2006.01) |
| H03K 19/0185 | (2006.01) |
| H02M 3/158 | (2006.01) |

(52) U.S. Cl.
CPC ......... *H03K 19/0013* (2013.01); *H02M 3/1588* (2013.01); *H03K 19/018507* (2013.01); *Y02B 70/1466* (2013.01)

(58) Field of Classification Search
CPC ........... G06F 1/46; H02M 1/08; H03K 17/04; H03K 2017/6875; H03K 3/012
USPC ......... 323/222, 225, 271, 277, 315, 282–288; 327/309, 390, 427, 530, 535–540, 333
See application file for complete search history.

(56) References Cited

U.S. PATENT DOCUMENTS

| 5,617,016 A * | 4/1997 | Borghi et al. .................. 323/284 |
| 6,043,699 A * | 3/2000 | Shimizu ........... H03K 3/356113 326/80 |
| 7,071,660 B2 * | 7/2006 | Xu ........................ H02M 3/156 323/266 |
| 7,863,877 B2 * | 1/2011 | Briere ................. H01L 27/0211 323/222 |
| 7,960,997 B2 * | 6/2011 | Williams ........... G01R 19/0092 324/762.09 |
| 8,063,616 B2 * | 11/2011 | Bahramian et al. ........... 323/271 |
| 8,836,305 B2 * | 9/2014 | Sasao et al. .................... 323/282 |

FOREIGN PATENT DOCUMENTS

TW    I343185 B    6/2011

* cited by examiner

*Primary Examiner* — Rajnikant Patel
(74) *Attorney, Agent, or Firm* — CKC & Partners Co., Ltd.

(57) ABSTRACT

A level shift circuit and a DC-DC buck converter controller for using the same are disclosed. The level shift circuit is capable of detecting a state of a converting circuit, and avoids a current leakage when determining that the converting circuit is operating under a light-load. Therefore, the level shift circuit and the DC-DC converting controller provided by the present invention can reduce power consumption under the light-load and have power-saving advantage.

10 Claims, 10 Drawing Sheets

LEVEL SHIFT CIRCUIT AND DC-DC CONVERTER FOR USING THE SAME

RELATED APPLICATIONS

This application claims priority to Chinese Application Serial Number 201310561010.8, filed Nov. 12, 2013, which is herein incorporated by reference.

BACKGROUND

1. Field of Invention

The invention relates to a level shift circuit and a DC-DC buck converter controller for using the same, and more particularly relates to a level shift circuit with a power-saving function and a DC-DC buck converter controller for using the same.

2. Description of Related Art

In the conventional DC-DC buck converting circuit, a level shift circuit is required to adjust the signal level for correctly turn on and off the high-side transistor of an N-type MOSFET. However, the conventional current type level shift circuit has a large power consumption and leakage paths, and so is not suitable for light-load. On the other hand, the conventional pulse type level shift circuit has no problems of leakage paths and large power consumption, but the pulse type level shift circuit keeps levels of output signals thereof through a parasitic capacitance of a transistor. When a reference level of the level shift circuit flutters, it is easy to cause a logic state of the output signal of the level shift circuit to be changed. Thus, the anti-interference ability of the pulse type level shift circuit is very poor.

FIG. 1 is a schematic diagram of a conventional current type level shift circuit. A first logic low level VS1 and a first logic high level VP1 are two logic levels of a first logic family. A second logic low level VS2 and a second logic high level VP2 are two logic levels of a second logic family. The function of the level shift circuit is used to transforming a high logic level and a low logic level of one logic family, i.e., the first logic high level VP1 and the first logic low level VS1, into the other logic family, i.e. the second logic high level VP2 and the second logic low level VS2.

When a first input signal S is at the first logic high level VP1 and a second input signal R is at the first logic low level VS1, a transistor MN4 is turned on and a transistor MN5 is turned off. At this moment, a current of a current source Ib flows through the current mirror composed of transistors MN1 and MN2 to make a current mirrored flow through the transistors MP1, MN4 and MN2. A transistor MP2 also simultaneously mirrors the current of the transistor MP1 to make a level of a first output signal Q raise to the second logic high level VP2. Moreover, because the transistor MN5 is cut off and leads to no current, the transistors MP4 and MP3 are also cut off. Because the level of the first output signal Q is at the second logic high level VP2 and a transistor MN7 is turned on, a potential of a second output signal QN is reduced to the second logic low level VS2. Similarly, when the first input signal S is at the first logic low level VS1 and the second input signal R is at the first logic high level VP1, the level of the first output signal Q is at the second logic low level VS2 and the level of the second output signal ON is at the second logic high level VP2. According to the level shift mentioned above, the first input signal S and the second input signal R of the first logic high level VP1 and the first logic low level are transformed into the first output signal Q and the second output signal QN of the second logic high level VP2 and the second logic low level VS2.

For ensuring a transforming speed of the level shift, when the first input signal S is at a high level and the second signal R is at a low level, the current flowing from the second logic high level VP2 via the transistors MP1, MN4 and MN2 to the first logic low level VS1 is designed to be larger. Similarly, when the first input signal S is at a low level and the second input signal R is at a high level, the current flowing from the second logic high level VP2 via the transistors MP4, MN5 and MN3 to the first logic low level VS1 is also designed to be larger. This circuit design can ensure the transforming speed of the level shift in the current type level shift circuit. However, such circuit design has the higher power consumption. Especially, the DC-DC buck converting circuit operates under a light-load, such as the diode emulation mode. In this mode, the larger current continuously flowing through the current type level shift circuit is not conducive to power-saving. The second logic high level VP2 may be provided by an extra boost circuit, not provided by an independent voltage source. The larger current continuously flowing leads to the second logic high level VP2 falling down and so a voltage difference between the second high level VP2 and the second logic low level VS2 is decreased.

FIG. 2 is schematic diagram of a conventional improved current type level shift circuit. Compared with that shown in FIG. 1, the improved current type level shift circuit extra increases transistors MN8 and MN9. The main function of the transistors MN8 and MN9 is voltage suppression, and gate electrodes thereof are coupled to the first logic high level VP1 for ensuring source electrodes of the transistors MN8 and MN9, i.e., potentials of drain electrodes of the transistors MN4 and MN5 are clamped under the first logic high level VP1. Under this circuit design, both the transistors MN4 and MN5 can be low-voltage transistors, and it is conducive to raise the switching speed of the transistors MN4 and MN5. However, large power consumption problem still exists.

FIG. 3 is a schematic diagram of a conventional pulse type level shift circuit. Pulse signals VPS and VPR are pulse signals respectively triggered on rising-edges of the first input signal S and the second signal R, and have narrow pulse widths. The pulse signals VPS and VPR are respectively coupled to gate electrodes of transistors MN2 and MN3. FIG. 4 shows waveform diagrams of the pulse type level shift circuit shown in FIG. 3. When both the first input signal S and the pulse signal VPS are at the first logic high level VP1 and the second input signal R is at the first logic low level VS1, a large current flows from the second logic high level VP2 via the transistors MP1, MN4 and MN2 to the first logic low level VS1. The transistor MP2 mirrors a current of the transistor MP1 to make the first output signal Q raise to the second logic high level VP2, while the second output signal QN is at the second logic low level VS2. When the first input signal S is still at the first logic high level VP1 and the pulse signal VPS is changed to be at the first logic low level VS1, the current of the transistor MP1 is zero. At this moment, the whole level shift circuit does not consume any current. Similarly, when both the second input signal R and the pulse signal VPR are at the first logic high level VP1 and the first input signal S at is the first logic low level VS1, the large current flows from the second logic high level VP2 via the transistors MP4, MN5 and MN3 to the first logic low level VS1. The transistor MP3 mirrors the current of the transistor MP4 to make the second output signal QN raise to the second logic high level VP2, while the first output signal Q is at the second logic low level VS2. Soon after, when the second input signal R is still at the first logic high level VP1 and the pulse signal VPR is changed to be at the first logic low level VS1. At this moment, the whole level shift circuit does not consume any current.

Advantages of the pulse type level shift circuit are speeding up the translating speed of the level shift due to the large current flowing through the pulse type level shift circuit, and lowering power consumption due to no current consumption after level shift has completed. However, the pulse type level shift circuit still has defects. When both the pulse signals VPR and VPS are at the logic low level, the levels of the first output signal Q and the second output signal QN are kept by the parasitic capacitances of the transistors, which causes the pulse type level shift circuit has poor anti-noise ability.

FIG. 5 is a schematic diagram of a level shift circuit disclosed in U.S. Pat. No. 7,839,197 of RICHTEK Technology Corporation. The level shift circuit shown in FIG. 5 is designed with the advantages of the pulse type level shift circuit and the current type level shift circuit. FIG. 6 shows waveform diagrams of the pulse type level shift circuit shown in FIG. 5. When the first input signal S and the pulse signal VPS are at the first logic high level VP1 and the second input signal R is at the first logic low level VS1, a current flows from the second logic high level VP2 via the transistors M1, M5 and M11 and a basic current source 642 to the first logic low level VS1. At this moment, a transistor M8 mirrors a current of the transistor M1 to make the first output signal Q be at the second logic high level VP2 and the second output signal QN be at the second logic low level VS2. When the first input signal S is still at the first logic high level VP1 and the pulse signal VPS is changed to be at the first logic low level VS1, the transistor M111 is cut off and the basic current source 642 still maintains a small basic current flowing through the transistors M5 and M1, and the small current is used to maintain the first output signal Q to continuously be at the second logic high level VP2. Similarly, when the second input signal R and the pulse signal VPR are at the first logic high level VP1 and the first input signal S is at the first logic low level VS1, the current flows from the second logic high level VP2 via the transistors M4, M6 and M12 and a basic current source 644 to the first logic low level VS1. At this moment, a transistor M7 mirrors a current of the transistor M4 to make the second output signal QN be at the second logic high level VP2 and the first output signal Q become the second logic low level VS2. When the second input signal R is still at the first logic high level VP1 and the pulse signal VPR is changed to be at the first logic low level VS1, the transistor M12 is cut off and the basic current source 644 still maintains a small basic current flowing through the transistors M6 and M4, and the small current is used to maintain the second output signal QN to be continuously at the second logic high level VP2. The transistors M2 and M3 are two mirror acceleration transistors.

Advantages of the level shift circuit shown in FIG. 5 involves the advantage of the high speed level shift of the pulse type level shift circuit and the good anti-noise ability of the current type level shift circuit. FIG. 7 shows waveform diagrams of the second logic high level VP2 and the second logic low level VS2 of the level shift circuit shown in FIG. 5. In the continuous current mode, the converting circuit continuously operates to make the boost circuit retain the potential of the second logic high level VP2. However, in the diode emulation mode, the basic current sources 642 and 644 of the level shift circuit still provide the small current and continuously consumes the energy stored in the boost circuit, and it causes the voltage difference between the second logic high level VP2 and the second logic low level VS2 slowly dropping down and further is possible to cause the problem of the logic error level of the first output signal Q and the second output signal QN.

SUMMARY

In view of the problems of the level shift circuit of the prior art, the level shift circuit of the present invention can avoid the level shift circuit consuming additional currents for achieving the advantages of reducing the power consumption, and further avoid the logic error level of the output signal when the converting circuit is operating under the light-load.

To accomplish the aforementioned and other objects, the present invention provides a level shift circuit, comprising a signal input circuit, a signal output circuit and a state detecting circuit. The signal input circuit is coupled between a first level and a second level, configured to receive a first input signal and a second input signal. Levels of the first input signal and the second input signal are switched between the first level and a third level. The signal input circuit generates a first current when the first input signal is at the third level, and generates a second current when the second input signal is at the third level. The signal output circuit is coupled between the second level and a fourth level, configured to output a first output signal and a second output signal. Levels of the first output signal and the second output signal are switched between the second level and the fourth level. The first output signal is switched to the second level when the signal input circuit generates the first current. The second output signal is switched to the second level when the signal input circuit generates the second current. The state detecting circuit detects an operating state of a converting circuit, and accordingly determines whether generating a stop signal for stopping the signal input circuit generating the first current and the second current.

The present invention also provides a DC-DC buck converter controller, adapted to control a first power switch and a second power switch of a converting circuit connected in series. The first power switch is coupled to an input voltage and a connection node, and the second power switch is coupled to the connection node and a common potential. The DC-DC buck converter controller comprises a feedback control circuit, a level shift circuit and a driver. The feedback control circuit generates a pulse width modulating signal according to a detecting signal indicative of a state of the converting circuit. A level of the pulse width modulating signal is switched between the common potential and a driving potential. The level shift circuit generates a level shift signal according to the pulse width modulating signal. The level shift circuit comprises a signal input circuit, a signal output circuit and a state detecting circuit. The signal input circuit is coupled between the common potential and a reference potential. The signal input circuit generates a first current when the pulse width modulating signal is at the driving potential, and generates a second current when the pulse width modulating signal is at the common potential. The signal output circuit is coupled between the reference potential and the connection node, configured to output the level shift signal. A level of the level shift signal is switched between the reference potential and a potential of the connection node. The level shift signal is switched to the reference potential when the signal input circuit generates the first current, and the level shift signal is switched to the potential of the connection node when the signal input circuit generates the second current. The state detecting circuit detects an operating state of the converting circuit and accordingly determines whether generating a stop signal for stopping the signal input circuit generating the first current and the second current. The driver is coupled to the level shift circuit and the feedback control circuit, and generates a high-side control signal and a low-side control signal according to the pulse width modulating signal and the level shift signal for respectively turning on and off the first power switch and the second power switch.

Besides, the level shift circuit of the present invention also can additionally add a time delay for avoiding the noise interference and further raising anti-noise ability.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments, it will be apparent, however, that one or more embodiments may be practiced without these specific details. In other instances, well-known structures and devices are schematically shown in order to simplify the drawings.

Figure 1:
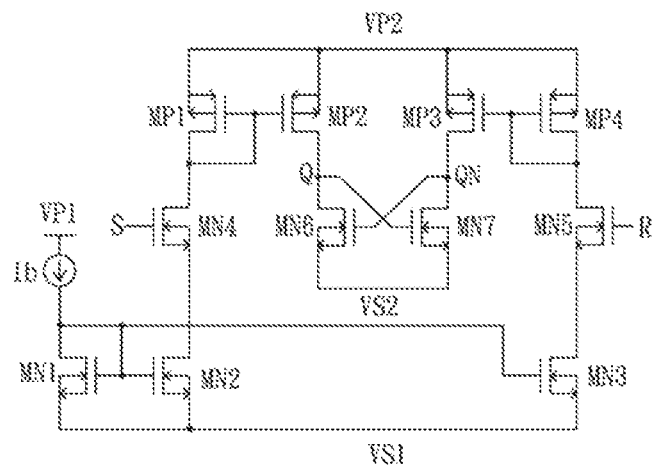
FIG. 1 is a schematic diagram of a conventional current type level shift circuit.
Figure 2:
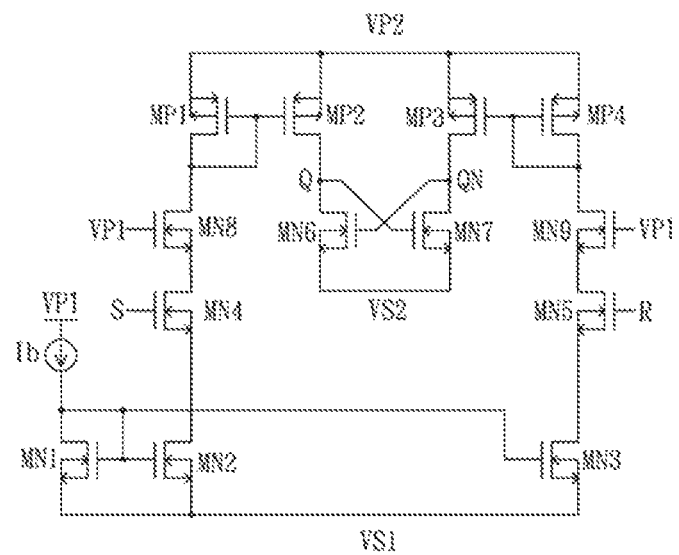
FIG. 2 is a schematic diagram of a conventional modified current type level shift circuit.
Figure 3:
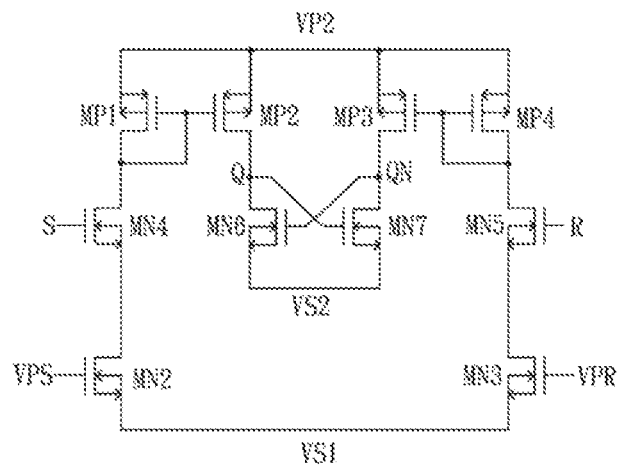
FIG. 3 is a schematic diagram of a conventional pulse type level shift circuit.
Figure 4:
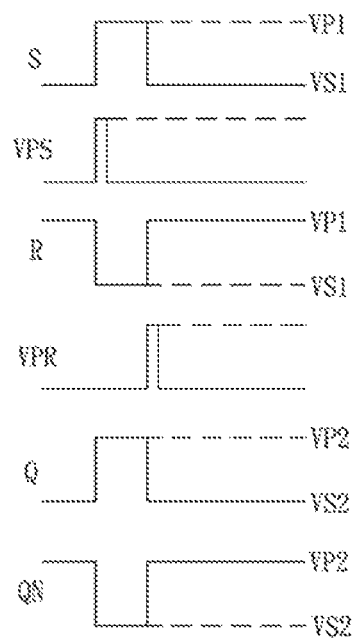
FIG. 4 shows waveform diagrams of the pulse type level shift circuit shown in FIG. 3.
Figure 5:
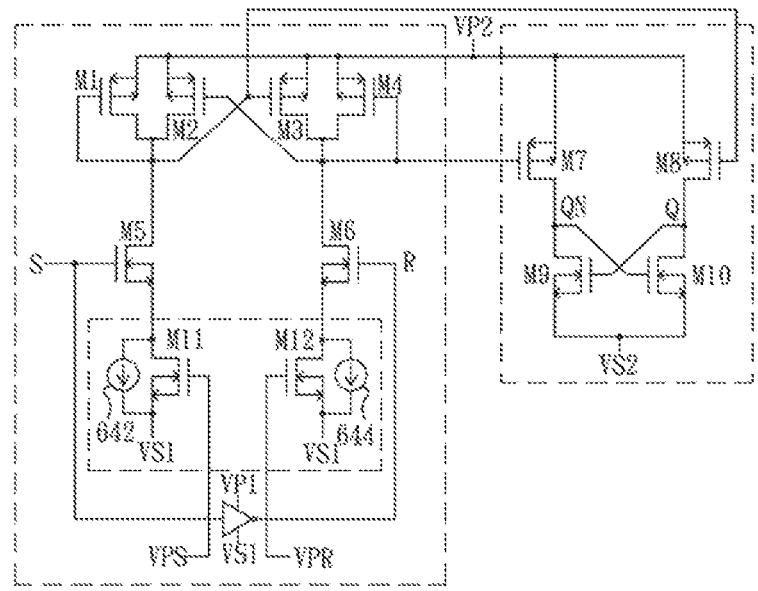
FIG. 5 is a schematic diagram of a level shift circuit disclosed in U.S. Pat. No. 7,839,197 of RICHTEK Technology Corporation.
Figure 6:
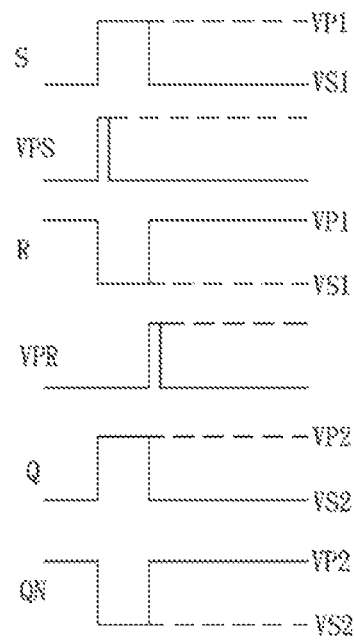
FIG. 6 shows waveform diagrams of the pulse type level shift circuit shown in FIG. 5.
Figure 7:
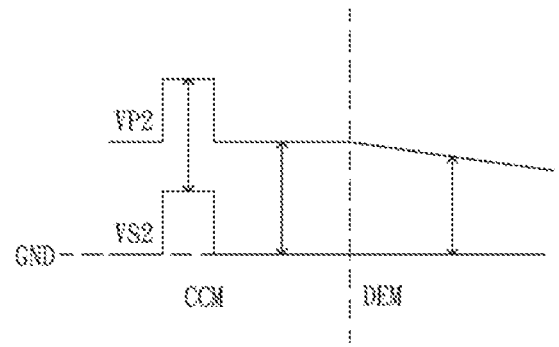
FIG. 7 shows waveform diagrams of the second logic high level VP2 and the second logic low level VS2 of the level shift circuit shown in FIG. 5.
Figure 8:
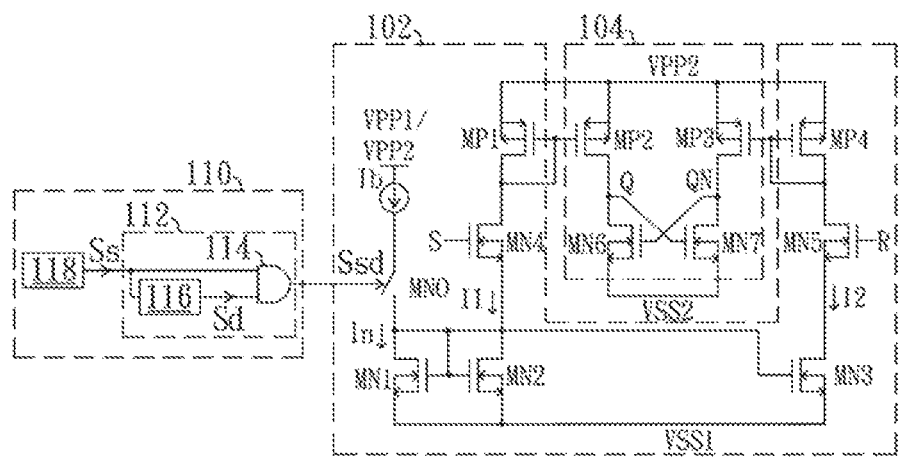
FIG. 8 is a schematic diagram of a level shift circuit according to a first preferred embodiment of the present invention.
Figure 9:
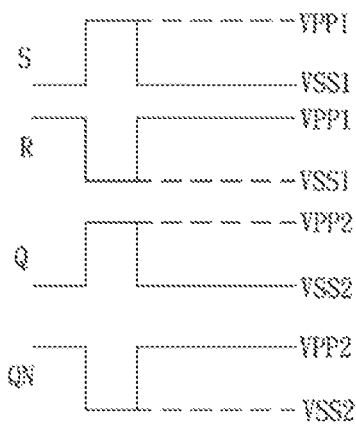
FIG. 9 shows waveform diagrams of the level shift circuit shown in FIG. 8.

FIG. 8 is a schematic diagram of a level shift circuit according to a first preferred embodiment of the present invention. The level shift circuit comprises a signal input circuit 102, a signal output circuit 104 and a state detecting circuit 110. The signal input circuit 102 is coupled between a first level VSS1 and a second level VPP2, configured to receive a first input signal S and a second input signal R. Also referring to FIG. 9, FIG. 9 shows waveform diagrams of the level shift circuit shown in FIG. 8. Levels of the first input signal S and the second input signal R are switched between the first level VSS1 and a third level VPP1. In the present embodiment, the signal input circuit 102 comprises transistors MN1~MN5, MP1 and MP4, a current switch MN0 and a current source Ib. The current source Ib is coupled to the third level VPP1 or the second level VPP2, and provides a current In flowing through the transistor MN1 when the current switch MN0 is turned on. The transistors MN2 and MN3 mirror the current In of the transistor MN1 for respectively providing a first current I1 and a second current I2. The signal input circuit 102 generates the first current I1 flowing through the transistors MP1, MN4 and MN2 when the first input signal S is at the third level VPP1, and generates the second current I2 flowing through the transistors MP4, MN5 and MN3 when the second input signal R is at the third level VPP1. The signal output circuit 104 is coupled between the second level VPP2 and a fourth level VSS2, configured to output a first output signal Q and a second output signal QN. Levels of the first output signal Q and the second output signal QN are switched between the second level VPP2 and the fourth level VSS2.

The signal output circuit 104 comprises transistors MP2~MP3 and MN6~MN7. When the signal input circuit 102 generates the first current I1, the transistor MP2 of the signal output circuit 104 mirrors the first current I1 to make the first output signal Q be switched to the second level VPP2. At this moment, the second output signal QN is switched to the fourth level VSS2. Similarly, the signal input circuit 102 generates the second current I2, the transistor MP3 of the signal output circuit 104 mirrors the second current I2 to make the second output signal QN be switched to the second level VPP2. At this moment, the first output signal Q is switched to the fourth level VSS2.

The state detecting circuit 110 detects an operating state of a converting circuit (not shown), such as detecting the voltage and/or the current, for judging the operating state, and determines whether generating a stop signal Ssd for stopping the signal input circuit 102 to generate the first current I1 and the second current I2 according to the operating state of the converting circuit. In the present embodiment, detecting the current of the converting circuit is taken as an example to illustrate.

The state detecting circuit 110 comprises a delay judging circuit 112 and a current detecting circuit 118. The current detecting circuit 118 is coupled to the converting circuit for detecting a current of the converting circuit and generates a light-load notice signal Ss when detecting the current of the converting circuit is smaller than a light-load judging value. The state detecting circuit 110 determines whether generating the stop signal Ssd according to the light-load notice signal Ss. The delay judging circuit 112 is coupled to the current detecting circuit 118, and generates the stop signal Ssd when the current detecting circuit 118 generates the light-load notice signal Ss lasting a preset delay time period. The delay judging circuit 112 comprises an AND gate 114 and a delay circuit 116. The delay circuit 116 outputs a delay signal Sd when continuously receiving the light-load notice signal Ss for the preset delay time period. The AND gate 114 is coupled to the delay circuit 116 and the current detecting circuit 118, and generates the stop signal Ssd when receiving both the light-load notice signal Ss and the delay signal Sd.

If the stop signal Ssd is not generated, the current switch MN0 is turned on. Under this condition, the current In provided by the current source Ib flows through the transistor MN1, and the transistors MN2 and MN3 mirror the current In and respectively generate the first current I1 and the second current I2. However, if the converting circuit operates in a light-load state, the stop signal Ssd is generated to cut off the current switch MN0. Under this condition, the current of the transistor MN1 is zero, and so both the transistors MN2 and MN3 of the signal input circuit 102 have no current. That is, the signal input circuit 102 stops generating the first current I1 and the second current I2. Thus, when the converting circuit operates under the light-load state, for example: the discontinuous current mode, the diode emulation mode, and so on, the level shift of the present invention reduce the power consumption to achieve the power-saving advantage.

Figure 10:
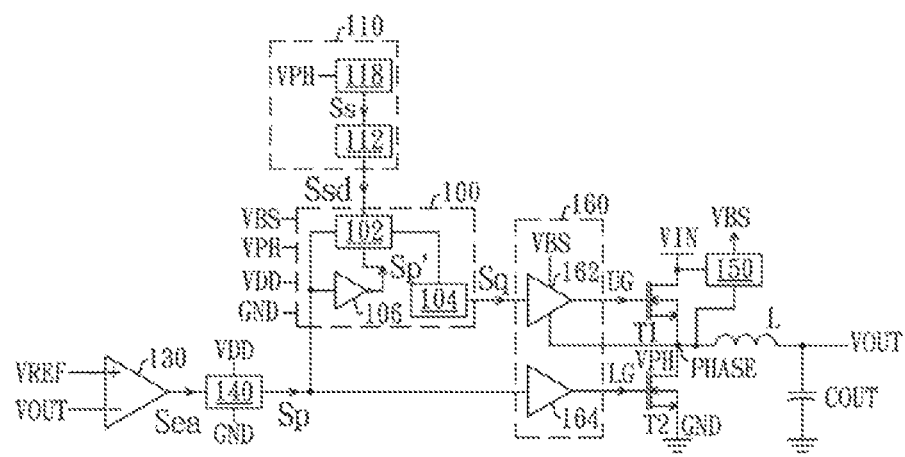
FIG. 10 is schematic diagram of a DC-DC buck converter controller applying a level shift circuit of a preferred embodiment of the present invention.

FIG. 10 is schematic diagram of a DC-DC buck converter controller applying a level shift circuit of a preferred embodiment of the present invention. The converting circuit comprises a first power switch T1 and a second power switch T2 connected in series, an inductance L and a capacitance COUT. The first power switch T1 is coupled to an input voltage VIN and a connection node PHASE, and the second power switch T2 is coupled to the connection node PHASE and a common potential GND. The inductance L is coupled to the connection node PHASE and the output capacitance COUT, and the output capacitance COUT provides an output voltage VOUT. The DC-DC buck converter controller generates a high-side control signal UG and a low-side control signal LG for respectively turning on and off the first power switch T1 and the second power switch T2. The DC-DC buck converter controller comprises a feedback control circuit, a level shift circuit and a driver 160. The feedback control circuit comprises an error amplifier 130 and a PWM (pulse width modulated) logic circuit 140. The error amplifier 130 receives a reference signal VREF and a detecting signal indicative of a state of the converting circuit, and generates an error amplification signal Sea according to the state of the converting circuit. In the present embodiment, the detecting signal represents the output voltage VOUT, and in actual application, it also can be a detecting signal indicative of an output current of the converting circuit. The PWM logic circuit 140 is coupled to the error amplifier 130 and generates a PWM (pulse width modulating) signal Sp according to the error amplification signal Sea. The PWM logic circuit 140 is coupled to a driving potential VDD and the common potential GND, and so a level of the PWM signal Sp is switched between the common potential GND and the driving potential VDD. The level shift circuit is coupled to a connection node potential VPH of the connection node PHASE, the driving potential VDD, the common potential GND and a reference potential VBS, and generates a level shift signal Sq (i.e., the first output signal Q or the second output signal QN of the embodiment in FIG. 8) according to the PWM signal Sp. The reference potential VBS, providing a potential higher than the input voltage VIN, is used for ensuring that the DC-DC buck converter controller correctly control the first power switch T1 to be turned on and off. The reference potential VBS may be provided by a voltage source independent of the input voltage VIN, or additionally adding a bootstrap circuit 150 as the present embodiment. The bootstrap circuit 150 is coupled to the connection node PHASE and the input voltage VIN, and provides the reference potential VBS through the switching process of the first power switch T1.

The level shift circuit of the present invention may be the level shift circuit shown in FIG. 8 or a level shift circuit shown in other embodiments. In the present embodiment, take the level shift circuit shown in FIG. 8 to illustrate. For conveniently understand the operation of the DC-DC buck converter controller with respect to that shown in FIG. 8, relationships of the logic levels between the two embodiments are illustrated in the following: the first level VSS1, the second level VPP2, the third level VPP1 and the fourth level VSS2 respectively corresponding to the common potential GND, the reference potential VBS, the driving potential VDD and the connection node potential VPH.

The level shift circuit comprises a level shift circuit 100 and a state detecting circuit 110. The level shift circuit 100, coupled to the common potential GND, the reference potential VBS, the driving potential VDD and the connection node potential VPH, comprises a signal input circuit 102, a signal output circuit 104 and an inverter 106. The inverter 106 is configured to receive the PWM signal Sp, and provides an inverted PWM signal Sp'. The PWM signal Sp and the inverted PWM signal Sp' respectively serve as the first input signal S and the second input signal R for inputting into the signal input circuit 102. The signal input circuit 102 generates a first current I1 when the PWM signal Sp is at the driving potential VDD, and generates a second current I2 when the PWM signal Sp is at the common potential GND. The signal output circuit 104 is configured to generate the level shift signal Sq, and the level shift signal Sq is switched to the reference potential VBS when the signal input circuit 102 generates the first current I1, and the level shift signal Sq is switched to the connection potential VPH when the signal input circuit 102 generates the second current I2.

The state detecting circuit 110 detects an operating state of the converting circuit and accordingly determines whether generating a stop signal Ssd for stopping the signal input circuit 102 to generate the first current I1 and the second current I2. In the present embodiment, the state detecting circuit 110 is coupled to the connection node PHASE for detecting the current of the inductance L. The state detecting circuit 110 comprises a delay judging circuit 112 and a current detecting circuit 118. The current detecting circuit 118 detects the current of the inductance L and generates a light-load notice signal Ss when detecting that a current of the inductance L is lower than a current reverse threshold value. The delay judging circuit 112 is coupled to the current detecting circuit 118 and generates the stop signal Ssd when the current detecting circuit 118 continuously generates the light-load notice signal Ss for a preset delay time period Td.

The driver 160 is coupled to the level shift circuit and the feedback control circuit and generates the high-side control signal UG and the low-side control signal LG according to the PWM signal Sp and the level shift signal Sq for respectively turning on and off the first power switch T1 and the second power switch T2. The driver 160 comprises an upper driver 162 and a lower driver 164. The upper driver 162 is coupled to the bootstrap circuit 150 and the connection node PHASE for receiving the reference potential VBS and the connection node potential VPH. The upper driver 162 is also coupled to the level shift circuit, and generates the high-side control signal UG according to the level shift signal Sq. The lower driver 164 is coupled to the feedback control circuit, and generates the low-side control LG according to the PWM signal Sp.

Figure 11:
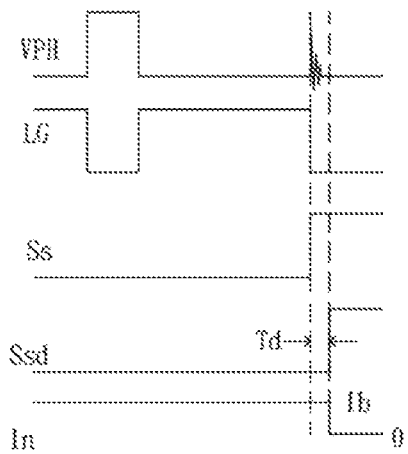
FIG. 11 shows waveform diagrams of the level shift circuit shown in FIG. 10.

FIG. 11 shows waveform diagrams of the level shift circuit shown in FIG. 10. Also referring to FIG. 10, the current detecting circuit 118 generates the light-load notice signal Ss when judging an inductance current flowing reversely. The delay judging circuit 112 generates the stop signal Ssd when the light-load notice signal Ss lasts the preset delay time period Td. Referring to FIG. 8, the stop signal Ssd cuts off the current switch MN0 to make the current of the transistor MN1 be zero, thereby stopping the first current I1 and the second current I2. Besides, it is worth to notice that the lower driver 164 cuts off the second power switch T2 for avoiding the inductance current flowing reversely against the coming reverse inductance current. At this moment, because both the first power switch T1 and the second power switch T2 are cut off, the connection node potential VPH of the connection node PHASE is oscillating. The bootstrap circuit 150 is coupled to the connection node PHASE, and so the oscillation of the connection node potential VPH affects the reference potential VBS. That leads to the noise interference. In the prior art, the current In is immediately cuts off to cause the erroneous level shift signal Sq of the level shift circuit 100. In contrast, in the present invention, the current In within the preset delay time period Td from when both the first power switch T1 and the second power switch T2 are cut off still exists to solve the noise-interference problems. Moreover, after oscillation of the connection node potential VPH (i.e., passing the preset delay time period Td), the current In is stopped for power-saving.

Figure 12:
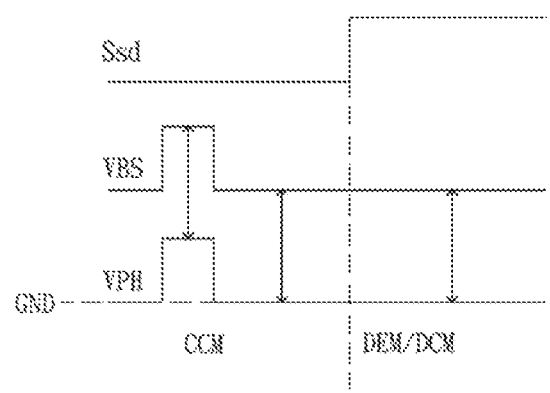
FIG. 12 shows waveform diagrams of the reference potential VBS and the connection node potential VPH in the level shift circuit shown in FIG. 10.

FIG. 12 shows waveform diagrams of the reference potential VBS and the connection node potential VPH in the level shift circuit shown in FIG. 10. When the current detecting circuit 118 detects the inductance current flowing reversely, i.e., the converting circuit enters into the light-load state, for example: DEM or DCM. After the preset delay time period, the state detecting circuit 110 generates the stop signal Ssd for cutting off the current In to make the level shift circuit 100 stop generating the first current I1 and the second current I2. At this moment, no more current of the level shift circuit 100 flows from the reference potential VBS to the connection node potential VPH, and that ensures the level difference of the reference potential VBS and the connection node potential VPH being maintained.

Figure 13:
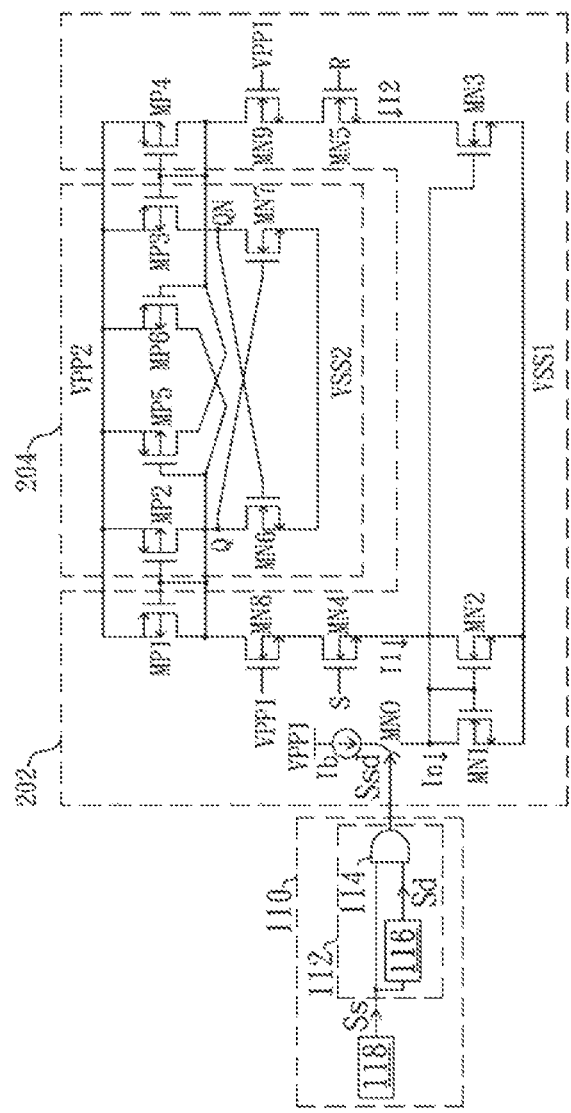
FIG. 13 is a schematic diagram of a level shift circuit according to a second preferred embodiment of the present invention.

FIG. 13 is a schematic diagram of a level shift circuit according to a second preferred embodiment of the present invention. Compared with the embodiment shown in FIG. 8, the main differences are that a signal input circuit 202 adds transistors MN8 and MN9, and a signal output circuit 204 adds transistors MP5 and MP6. Gate electrodes of the transistors MN8 and MN9 are coupled to the third level VPP1 to ensure source electrodes of the transistors MN8 and MN9, i.e., the drain electrodes of the transistors MN4 and MN5, being clamped below the third level VPP1. Thus, the transistors MN4 and MN5 can use the low-voltage transistor to reduce the cost of the level shift circuit. The transistors MP5 and MP6 functions as an accelerating circuit. A gate electrode of the transistor MP5 is coupled to a gate electrode of the transistor MP1, and a drain electrode thereof is coupled to a gate electrode of the transistor MP4. When the first current I1 is generated, the transistors MP1 and MP5 are simultaneously turned on. At this moment, the transistor MP5 can quickly raise the gate electrode of the transistor MP4 and completely cut off the transistor MP4 for quickly cutting off the second current I2. Similarly, a gate electrode of the transistor MP6 is coupled to the gate electrode of the transistor MP4, and a drain electrode thereof is coupled to the gate electrode of the transistor MP1. When the second current I2 is generated, the transistors MP4 and MP6 are simultaneously turned on. At this moment, the transistor MP6 can quickly raise the gate electrode of the transistor MP1 and completely cut off the transistor MP1 for quickly cutting off the first current I1.

Figure 14:
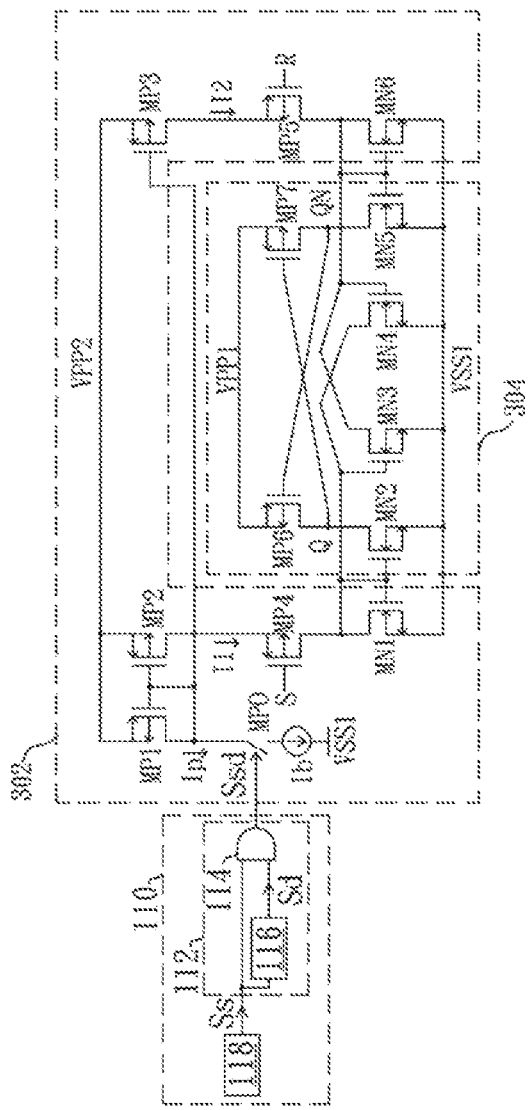
FIG. 14 is a schematic diagram of a level shift circuit according to a third preferred embodiment of the present invention.

FIG. 14 is a schematic diagram of a level shift circuit according to a third preferred embodiment of the present invention. The embodiments shown in FIG. 8 and FIG. 13 transfer the first input signal S and the second input signal R with the lower logic levels of the first level VSS1 and the third level VPP1 into the first output signal Q and the second output signal QN with the higher logic levels of the fourth level VSS2 and the second level VPP2. The level shift circuit shown in FIG. 14 transfer the first input signal S and the second input signal R with the higher logic levels of the fourth level VSS2 and the second level VPP2 into the first output signal Q and the second output signal QN with the lower level of the first level VSS1 and the third level VPP1.

Figure 15:
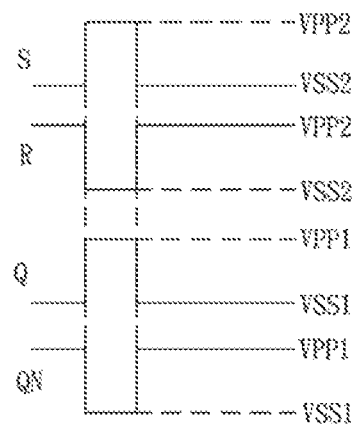
FIG. 15 shows waveform diagrams of the level shift circuit shown in FIG. 14.

FIG. 15 shows waveform diagrams of the level shift circuit shown in FIG. 14. Also referring to FIG. 14, a signal input circuit 302 is coupled between the first level VSS1 and the second level VPP2 and receives the first input signal S and the second input signal R. The levels of the first input signal S and the second input signal R are switched between the fourth level VSS2 and the second level VPP2. The signal input circuit 302 comprises the transistors MP1~MP5, MN1 and MN6, the current switch MN0 and the current source Ib. The current source Ib is coupled to the first level VSS1, and provides a current Ip flowing through the transistor MP1 when the current switch MN0 is turned on. A signal output circuit 304 is coupled between the third level VPP1 and the first level VSS1 and outputs the first output signal Q and the second output signal QN. The levels of the first output signal Q and the second output signal QN are switched between the third level VPP1 and the first level VSS1. The level shift circuit of the present embodiment is similar to the level shift circuits shown in FIG. 8 and FIG. 13, and the detailed description of the circuit operation can refer to the corresponding description in FIG. 8 and FIG. 13, and it will not repeated in here.

Figure 16:
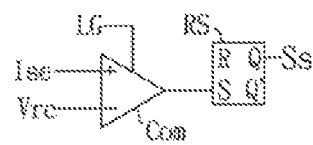
FIG. 16 is a schematic diagram of a current detecting circuit according to a preferred embodiment of the present invention.

FIG. 16 is a schematic diagram of a current detecting circuit according to a preferred embodiment of the present invention. In order to clearly understand the operation of the current detecting circuit, the current detecting circuit is applied to the circuit of FIG. 8 for illustrating. The current detecting circuit comprises a comparator Com and a RS flip-flop. The low-side control signal LG is used to enable and disable the comparator Com. The comparator Com is enabled when the low-side control signal LG is at a high level, i.e., the second power switch T2 is turned on, and is disabled when the low-side control signal LG is at a low level. A non-inverting input end of the comparator Com receives a current detecting signal Ise, and an inverting end thereof receives a light-load judging value Vrc. In the present embodiment, the light-load judging value Vrc is the ground potential, i.e., the common potential GND. When the second power switch T2 is turned on, the comparator Com is enabled for detecting whether the current of the second power switch T2 flows reversely. When the current detecting signal Ise is higher than the light-load judging value Vrc, the comparator Com generates a high level signal for triggering the RS flip-flop generating the light-load notice signal Ss. In actual application, the connection node potential VPH may serve as the current detecting signal Ise. When the connection node potential VPH is larger than zero, it represents that the inductance current flows reversely, i.e. from the inductance into the second power switch T2 and so the converting circuit operates in the light-load state. At this moment, the current detecting circuit generates the light-load notice signal Ss.

Figure 17:
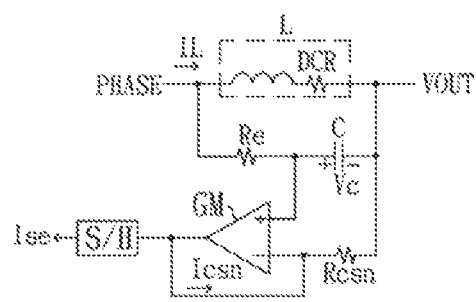
FIG. 17 is a schematic diagram of an inductance current detecting circuit according to a preferred embodiment of the present invention.

FIG. 17 is a schematic diagram of an inductance current detecting circuit according to a preferred embodiment of the present invention. The inductance current detecting circuit comprises a transconductance amplifier GM, a sample and hold circuit S/H, a detecting capacitance C and resistances Re and Rcsn. The inductance L is connected the series of the detecting capacitance C and the resistance Re in parallel. The inductance L has an inherent DC resistance DCR, and so a voltage across Vc of the capacitance C is proportional to an inductance current IL of the inductance L. A non-inverting input end of the transconductance amplifier GM is coupled to a connection node of the resistance Re and the detecting capacitance C, and an inverting input end thereof is coupled to the other end of the capacitance C through the resistance Rcsn. The transconductance amplifier GM generates an output current Icsn at an output end according to voltage levels at the non-inverting input end and the inverting input end. The non-inverting input end of the transconductance amplifier GM is coupled to the output end. Thus, the output current Icsn flows through the resistance Rcsn and form a voltage across of the resistance Rcsn to compensate the voltage across Vc of the capacitance C for making the voltage difference of the inverting input end and the non-inverting input end of the transconductance amplifier GM be zero. When the inductance current IL flows reversely, i.e., the inductance current IL flows back from the output voltage VOUT to the connection node PHASE, and the output current Icsn is smaller than or equal to zero. The sample and hold circuit S/H detects the voltage across Vc of the capacitance C at every cycle and accordingly generates the current detecting signal Ise. When the inductance current IL flows reversely, the current detecting signal Ise is larger than zero and so the inductance current detecting circuit generates the light-load notice signal Ss.

Figure 18:
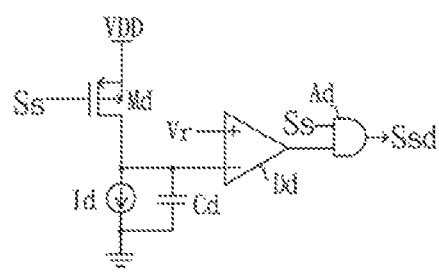
FIG. 18 is a schematic diagram of a delay judging circuit according to a preferred embodiment of the present invention.

FIG. 18 is a schematic diagram of a delay judging circuit according to a preferred embodiment of the present invention. The delay judging circuit comprises a switch Md, a current source Id, a capacitance Cd, a comparator Dd and an AND gate Ad. One end of the switch Md is coupled to the driving potential VDD, and the other end thereof is coupled to the current source Id. One end of the capacitance Cd is coupled to a connection node of the switch Md and the current source Id, and the other end thereof is coupled to the ground. A non-inverting input end of the comparator Dd receives a delay reference voltage Vr, and an inverting input end thereof is coupled to the capacitance Cd.

Figure 19:
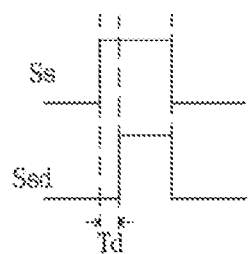
FIG. 19 shows waveform diagrams of the delay judging circuit shown in FIG. 18.

FIG. 19 shows waveform diagrams of the delay judging circuit shown in FIG. 18. When the light-load notice signal Ss is at a low level, the switch Md is turned on for making a voltage of the capacitance Cd be raised to the driving potential VDD, which is higher than the delay reference voltage Vr. At this moment, the AND gate Ad stops outputting the stop signal Ssd (i.e., the stop signal Ssd is at a low level). When the light-load notice signal Ss is changed to a high level, the switch Md is cut off. At this moment, the current source Id starts discharging the capacitance Cd, and so the voltage of the capacitance Cd starts dropping from the driving potential VDD. After the preset delay time period Td, the voltage of the capacitance Cd is lower than the delay reference voltage Vr, the comparator Dd output a high level signal. At this moment, both two signals received by the two input ends of the AND gate Ad are at high levels and the AND gate Ad outputs the stop signal Ssd. When the light-load notice signal Ss is changed from the high level to the low level, the switch Md is turned on for immediately charging the voltage across of the capacitance Cd to be the driving potential VDD. At this moment, the AND gate Ad stops outputting the stop signal Ssd.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A DC-DC buck converter controller, adapted to control a first power switch and a second power switch of a converting circuit connected in series, wherein the first power switch is coupled to an input voltage and a connection node, and the second power switch is coupled to the connection node and a common potential, the DC-DC buck converter controller comprising:
a feedback control circuit, generating a pulse width modulating signal according to a detecting signal indicative of a state of the converting circuit, wherein a level of the pulse width modulating signal is switched between the common potential and a driving potential;
a level shift circuit, generating a level shift signal according to the pulse width modulating signal, comprising:
a signal input circuit, coupled between the common potential and a reference potential, generating a first current when the pulse width modulating signal is at the driving potential, and generating a second current when the pulse width modulating signal is at the common potential;
a signal output circuit, coupled between the reference potential and the connection node, and configured to output the level shift signal, having a level being switched between the reference potential and a potential of the connection node, wherein the level shift signal is switched to the reference potential when the signal input circuit generates the first current, and the level shift signal is switched to the potential of the connection node when the signal input circuit generates the second current; and
a state detecting circuit, detecting an operating state of the converting circuit, and accordingly determining whether generating a stop signal for stopping the signal input circuit generating the first current and the second current; and
a driver, coupled to the level shift circuit and the feedback control circuit, and generating a high-side control signal and a low-side control signal according to the pulse width modulating signal and the level shift signal for respectively turning on and off the first power switch and the second power switch.

2. The DC-DC buck converter controller according to claim 1, wherein the converting circuit further comprises a bootstrap circuit, coupled to the connection node and the input voltage for providing the reference potential.

3. The DC-DC buck converter controller according to claim 2, wherein the converting circuit further comprises an inductance, and the state detecting circuit comprises a current detecting circuit, coupled to the converting circuit for detecting a current of the converting circuit, and generates a light-load notice signal when the current of the converting circuit is smaller than a light-load judging value, and the state detecting circuit determines whether generating the stop signal according to the light-load notice signal.

4. The DC-DC buck converter controller according to claim 2, wherein the signal output circuit comprises an accelerating circuit, which cuts off the second current when the first current is generated, and cuts off the first current when the second current is generated.

5. The DC-DC buck converter controller according to claim 2, wherein the driver comprises an upper driver and a lower driver, the upper driver is coupled to the level shift circuit and generates the high-side control signal according to the level shift signal, and the lower driver is coupled to the feedback control circuit and generates the low-side signal according to the pulse width modulating signal.

6. The DC-DC buck converter controller according to claim 3, wherein the state detecting circuit further comprises a delay judging circuit, coupled to the current detecting circuit, and generates the stop signal when the current detecting circuit generates the light-load notice signal lasting a preset delay time period.

7. The DC-DC buck converter controller according to claim 1, wherein the converting circuit further comprises an inductance, and the state detecting circuit comprises a current detecting circuit coupled to the converting circuit for detecting a current of the converting circuit and, generates a light-load notice signal when the current of the converting circuit is smaller than a light-load judging value, and the state detecting circuit determines whether generating the stop signal according to the light-load notice signal.

8. The DC-DC buck converter controller according to claim 7, wherein the state detecting circuit further comprises a delay judging circuit, coupled to the current detecting circuit, and generates the stop signal when the current detecting circuit generates the light-load notice signal lasting a preset delay time period.

9. The DC-DC buck converter controller according to claim 1, wherein the signal output circuit comprises an accelerating circuit, which cuts off the second current when the first current is generated, and cuts off the first current when the second current is generated.

10. The DC-DC buck converter controller according to claim 1, wherein the driver comprises an upper driver and a lower driver, the upper driver is coupled to the level shift circuit and generates the high-side control signal according to the level shift signal, and the lower driver is coupled to the feedback control circuit and generates the low-side signal according to the pulse width modulating signal.

\* \* \* \* \*